United States Patent
Fraiman

(10) Patent No.: US 10,468,875 B2
(45) Date of Patent: Nov. 5, 2019

(54) VARISTOR FAILURE DETECTOR AND METHOD

(71) Applicant: Siemens Canada Limited, Oakville, Ontario (CA)

(72) Inventor: Eduard Fraiman, Maple (CA)

(73) Assignee: SIEMENS CANADA LIMITED, Oakville, ON (CA)

(*) Notice: Subject to any disclaimer, the term of this patent is extended or adjusted under 35 U.S.C. 154(b) by 285 days.

(21) Appl. No.: 15/507,415

(22) PCT Filed: Oct. 9, 2014

(86) PCT No.: PCT/CA2014/050978
§ 371 (c)(1),
(2) Date: Feb. 28, 2017

(87) PCT Pub. No.: WO2016/054719
PCT Pub. Date: Apr. 14, 2016

(65) Prior Publication Data
US 2017/0288396 A1    Oct. 5, 2017

(51) Int. Cl.
*H02H 9/04* (2006.01)
*G01R 31/00* (2006.01)
*H02H 7/10* (2006.01)
*H02H 7/22* (2006.01)

(52) U.S. Cl.
CPC ............ *H02H 9/042* (2013.01); *G01R 31/00* (2013.01); *H02H 7/10* (2013.01); *H02H 7/22* (2013.01)

(58) Field of Classification Search
CPC ... H02H 1/00; G01R 1/00; H01R 3/00; H01R 2101/00; H01H 2201/00; H01H 69/00; H01H 2203/00
See application file for complete search history.

(56) References Cited

U.S. PATENT DOCUMENTS

| 4,338,648 A | 7/1982 | Subbarao |
| 4,495,459 A | 1/1985 | Kresge |
| 5,151,054 A * | 9/1992 | Briones ............... H01R 13/6582 439/620.1 |
| 6,879,478 B2 | 4/2005 | Mendoza et al. |
| 2006/0232906 A1 | 10/2006 | Sueoka |

(Continued)

FOREIGN PATENT DOCUMENTS

| CA | 2079116 A1 | 3/1993 |
| JP | H04308678 A | 10/1992 |

OTHER PUBLICATIONS

PCT International Search Report dated Jul. 14, 2015 corresponding to PCT International Application No. PCT/CA2014/050978 filed Oct. 9, 2014 (12 pages).

Primary Examiner — Huy Q Phan
Assistant Examiner — Temilade S Rhodes-Vivour

(57) ABSTRACT

A varistor failure detector includes one or more surge detector in communication with a varistor, to detect surges shunted by the varistor and a processor, in communication with the at surge detector(s). The processor is programmed to count surges shunted by the varistor, as indicated by the surge detector(s) and store at least one count representing a cumulative count of surges shunted by the varistor. An indicator of the count may be provided to an operator to indicate that the varistor should be replaced, to avoid catastrophic failure of the varistor.

15 Claims, 5 Drawing Sheets

(56) References Cited

U.S. PATENT DOCUMENTS

| | | | |
|---|---|---|---|
| 2006/0279885 A1* | 12/2006 | Sung | H02H 3/05 |
| | | | 361/42 |
| 2007/0097584 A1 | 5/2007 | Ducharme et al. | |
| 2007/0188962 A1* | 8/2007 | Baldwin | H02H 1/0053 |
| | | | 361/118 |
| 2009/0207034 A1 | 8/2009 | Tinaphong et al. | |
| 2011/0121816 A1* | 5/2011 | Okawa | G01R 33/1269 |
| | | | 324/113 |
| 2011/0149444 A1* | 6/2011 | Koolen | H05B 33/089 |
| | | | 361/18 |
| 2013/0083441 A1* | 4/2013 | Higashi | G01R 31/1236 |
| | | | 361/57 |
| 2013/0093595 A1 | 4/2013 | Lee | |
| 2014/0211359 A1* | 7/2014 | Senba | H04M 1/745 |
| | | | 361/119 |

\* cited by examiner

VARISTOR FAILURE DETECTOR AND METHOD

TECHNICAL FIELD

The present invention relates to varistors, and more particularly, to a varistor failure detector that may anticipate varistor failure.

BACKGROUND

Varistors are often used to protect the flow of increased current in the presence of excess voltage. As will be understood, a varistor is a voltage-dependent resistor. As such, varistors are often included in a circuit to shunt current created by high voltage away from sensitive components.

For example, a varistor may be used in power supplies that are supplied by AC mains (e.g. 110 or 220 volts AC). The varistor is usually placed downstream of the power supply fuse, between the AC mains live conductor and neutral. In the presence of a high transient voltage, the varistor clamps the voltage and shunts any resulting current.

A typical varistor is formed of a bulk material (such as ceramic) between two conducting plates. The bulk material contains grains of a conducting material (such as small amount of zinc, bismuth, cobalt or manganese) which acts to form diode junctions that allow current to flow only in one direction in the presence of a moderate voltage. Only small currents flow through the diode junctions, caused by reverse leakage. The presence of a large applied voltage, on the other hand, causes the diode junctions to break down and the varistor to conduct.

Unfortunately, after repeated breakdowns caused by applied high voltages the varistor may fail. Such a failure may be catastrophic to downstream components, and the varistor itself.

Accordingly, varistor circuits that allow for the prevention and/or detection of possible catastrophic failures are desirable.

SUMMARY

According to an aspect, there is provided a method of operating a power supply comprising supply lines and a varistor interconnected with the supply lines to shunt surges on the supply lines. The method comprises sensing a surge on the supply lines; protecting downstream components from the surge by clamping the surge by way of the varistor; sensing each the surge, and maintaining a cumulative count of surges shunted by the varistor; and providing an indicator of a count reflecting surges shunted by the varistor, as indicated by the cumulative count.

According to another aspect, there is provided a varistor failure detector comprising: at least one surge detector in communication with a varistor, to detect surges shunted by the varistor; a processor, in communication with the at least one surge detector, programmed to count surges shunted by the varistor, as indicated by the at least one surge detector; memory storing at least one count representing a cumulative count of surges shunted by the varistor.

According to a further aspect, there is provided a varistor module comprising a varistor and the varistor failure detector described above.

According to yet another aspect, there is provided a varistor module for interconnection with an electronic circuit, the varistor module comprising a substrate, a connector extending from the substrate, and a varistor electrically interconnected with the connector to allow solderless removal and replacement of the varistor module from the electronic circuit to allow the varistor to shunt surges on a supply line to a power supply of the electronic circuit.

Other features will become apparent from the drawings in conjunction with the following description.

BRIEF DESCRIPTION OF THE DRAWINGS

In the figures which illustrate example embodiments.

DETAILED DESCRIPTION

Figure 1:
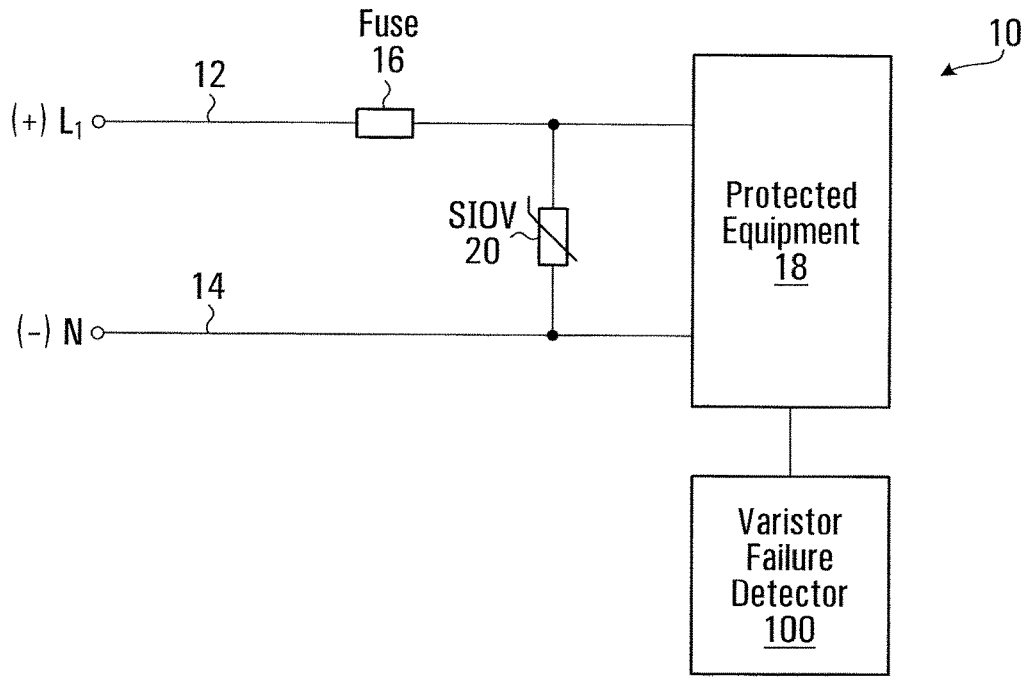
FIG. 1 is a schematic diagram of a circuit including a varistor and varistor failure detector.

FIG. 1 illustrates a typical protected circuit 10, protected with a varistor failure detector 100, exemplary of an embodiment of the present invention. As illustrated, in circuit 10, an alternating current (AC) supply voltage is provided by way of supply lines including live conductor line 12 and a neutral line 14. Varistor 20 is placed between live and neutral lines 12, 14 that provide primary power to downstream components 18. A fuse 16 is placed in series with live conductor line 12 and downstream electric/electronic components 18 to protect against over-current.

Example varistor 20 may be a metal oxide varistor (MOV). Downstream components 18 may include active or passive electronic components, a further regulating power supply, or the like. As such, live and neutral lines 12, 14 may provide a primary AC voltage that is converted into a regulated secondary DC voltage. Voltage conversion/regulation may be performed by a switching converter, transformer or the like.

In the example embodiment, varistor failure detector 100 may be in indirect communication with lines 12 and 14, by interconnection with downstream components 18, on the secondary side of the power supply.

Figure 2:
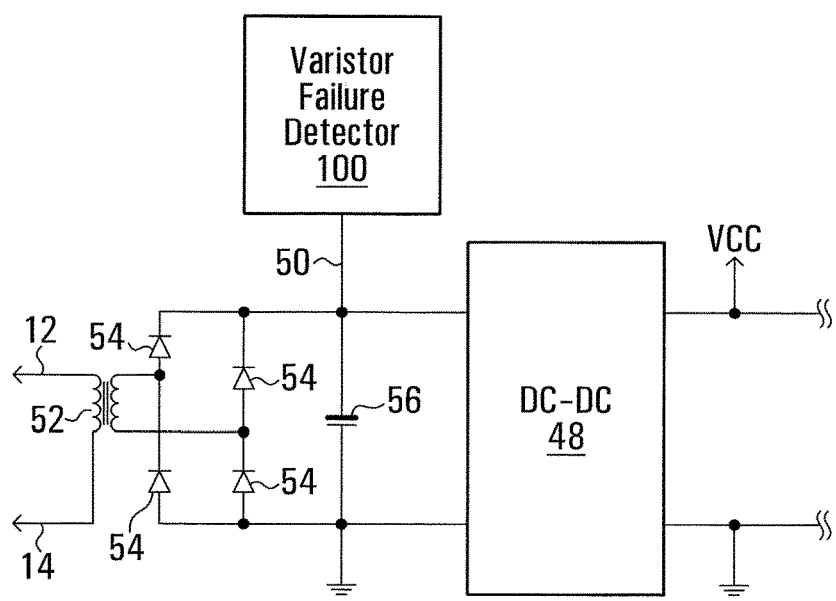
FIG. 2 is a schematic diagram of components of the circuit of FIG. 1.

FIG. 2 is a schematic block diagram of selected components of downstream components 18 interconnected with varistor failure detector 100. Varistor failure detector 100 is in communication with varistor 20 to detect surges shunted by varistor 20. In the depicted embodiment, varistor failure detector 100 is interconnected with an unregulated DC bus 50, which feeds a DC-DC converter 48 that produces a regulated DC voltage $V_{CC}$ for use by downstream components. DC voltage on DC bus 50 may be produced from lines 12, 14 by way of transformer 52, and rectifying diodes 54, further filtered by capacitor 56.

Figure 3A:
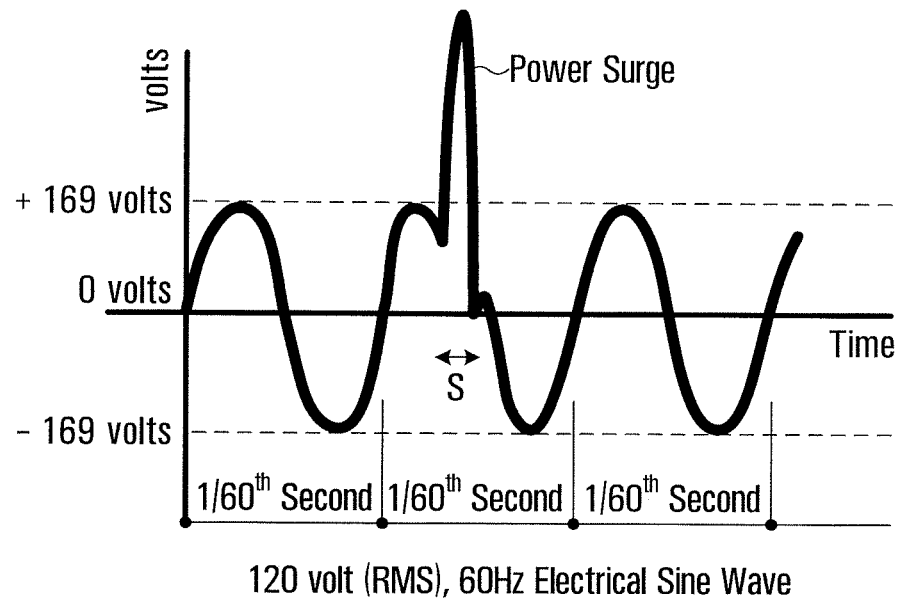
FIGS. 3A and 3B depict voltage waveforms in the presence of a voltage surge.
Figure 3B:
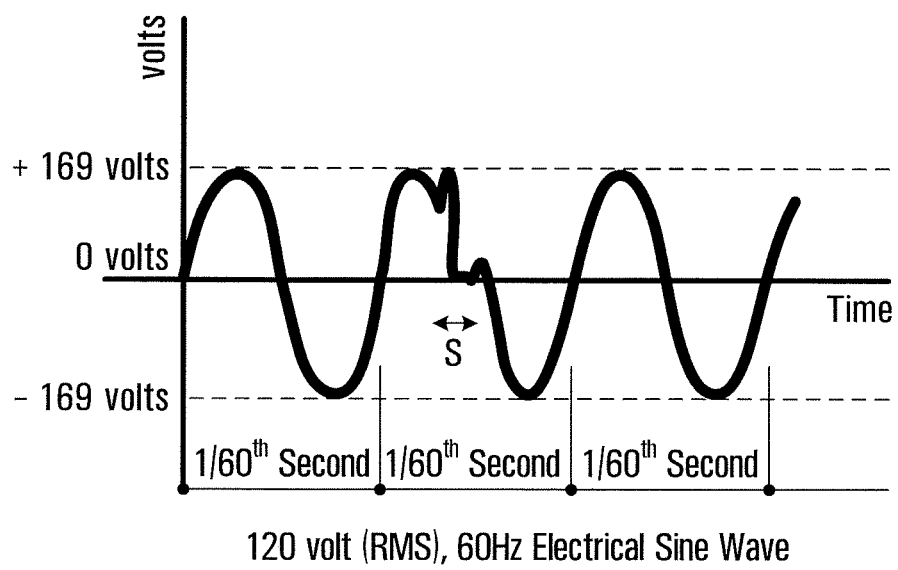

Surges and spikes on live and neutral lines 12, 14 may threaten downstream components 18, causing current and/or voltage surges. Varistor 20 protects downstream component from such surge, by clamping the voltage surge. To that end, FIGS. 3A and 3B illustrate the typical effect of a power surge on supply voltage on lines 12 and 14 as well as the resulting voltage on components protected by a varistor, such as the varistor 20. As illustrated, the typical AC mains voltage in North America is sinusoidal having a period of 1/60th of a second. A voltage surge in interval S may last for only a fraction of such a period. In the presence of a surge above a threshold voltage, varistor 20 assumes a low resistance state and conducts current between live line 12 and neutral line 14 to shunt current that might otherwise be provided to protected components 18. In the depicted FIGS. 3A and 3B this threshold voltage is 169 $V_{pp}$.

Unfortunately, each shunted surge may cause varistor 20 to become less effective for future failures, and increases the likelihood of a catastrophic failure.

Figure 4:
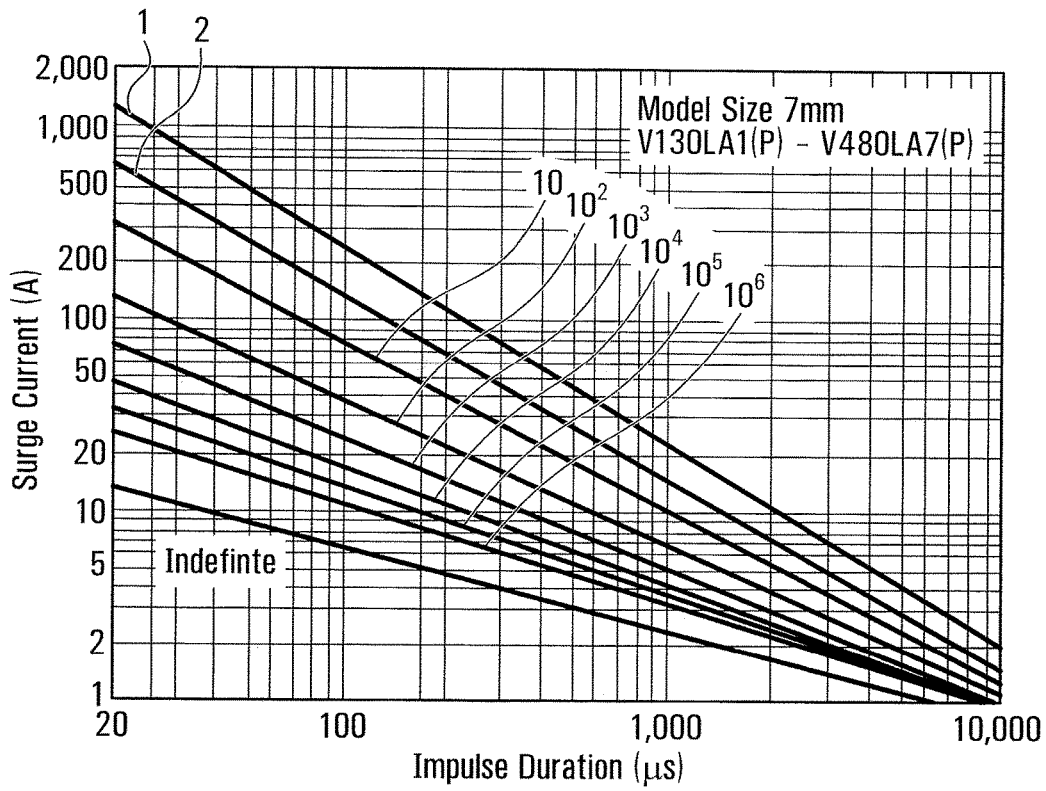
FIG. 4 is a rating curve for a typical varistor.

In particular, FIG. 4 illustrates a pulse rating curve for a conventional MOV. As illustrated, the varistor's surge protection capability decreases in the presence of repetitive surges. The amplitude (i.e. voltage) as well as duration of each surge will impact on the effectiveness of the varistor's ability to protect against future surges of varying amplitude and duration, and increases the likelihood of the next surge causing failure of the varistor. For example, a varistor may be rated for only a single surge of 1000 A having a duration of 20 uS, and 1000 surges of 75 A having a duration of 20 uS.

Conveniently then, varistor failure detector 100 may sense surges and count the number of surges that varistor 20 shunts. Varistor failure detector 100 may provide an indicator of a potential future failure of varistor 20, as further detailed below.

Figure 5:
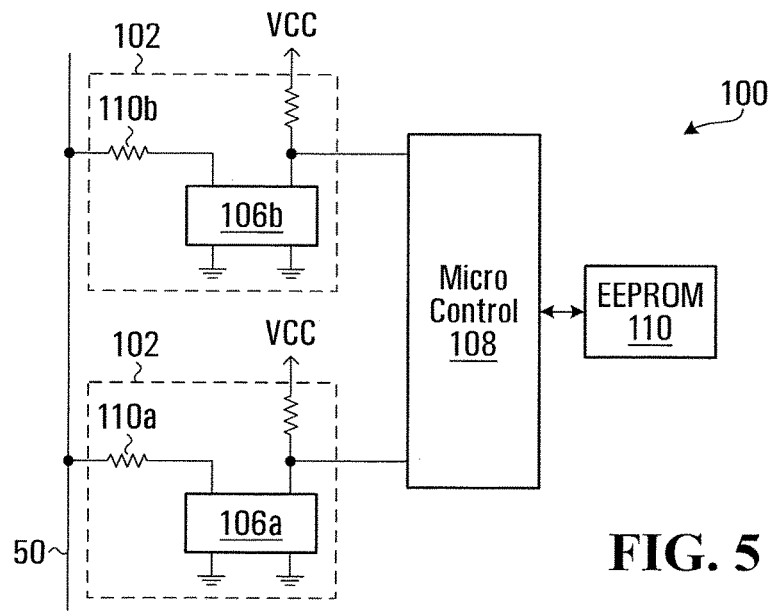
FIG. 5 is a schematic diagram of varistor failure detector of FIG. 1.

An example varistor failure detector 100 is schematically illustrated in FIG. 5. As illustrated, the varistor failure detector 100 may include one or more surge detectors 102, each including an isolator 106a, 106b (individually and collectively isolators 106), exemplified as opto-couplers tuned by tuning resistors 110a, 110b (individually and collectively tuning resistors 110). In FIG. 5, only two surge detectors are illustrated. However, failure detector 100 may have any number of surge detectors, each corresponding to a tuned threshold surge voltage. Surge detectors 102 are coupled to a processor 108—for example in the form of a microprocessor, or microcontroller, by way of isolators 106, which are in turn coupled to DC supply line 50. Processor 108 may thus count the number of surges above a threshold as sensed through the isolators 106. Memory 110 in the form of a suitable combination of persistent and dynamic memory, may store processor readable instructions, adapting processor 108 to operate as described herein, as well as the described surge count or counts. Memory 110 may for example be a suitable combination of static RAM, dynamic RAM, registers and read-only-memory.

Resistors 110 may be tuned to allow an associated detector 102 to detect surges of specific amplitude. That is, failure detector 100 is interconnected to unregulated DC bus 50 of circuit 10. Circuit 10 may be placed under test, and the effect of example surges of particular on lines 12 and 14 may be measured on this DC bus 50. Resistors may be tuned so that each resistor causes its associated detector 102 to sense a voltage surge on lines 12 and 14 above a particular threshold, causing its isolator 106 to assume a logic high in the presence of a surge voltage in excess of this tuned voltage. As will thus be appreciated, in this configuration, the higher the surge voltage and resulting spike on DC bus 50, the more detectors 102 will provide a logic high output. The logic outputs of the multiple detectors 102 may be provided to processor 108, by way of a suitable interface. Processor 108 may, in turn, count the number of surges at a particular voltage, and store the count in memory 110.

Figure 6:
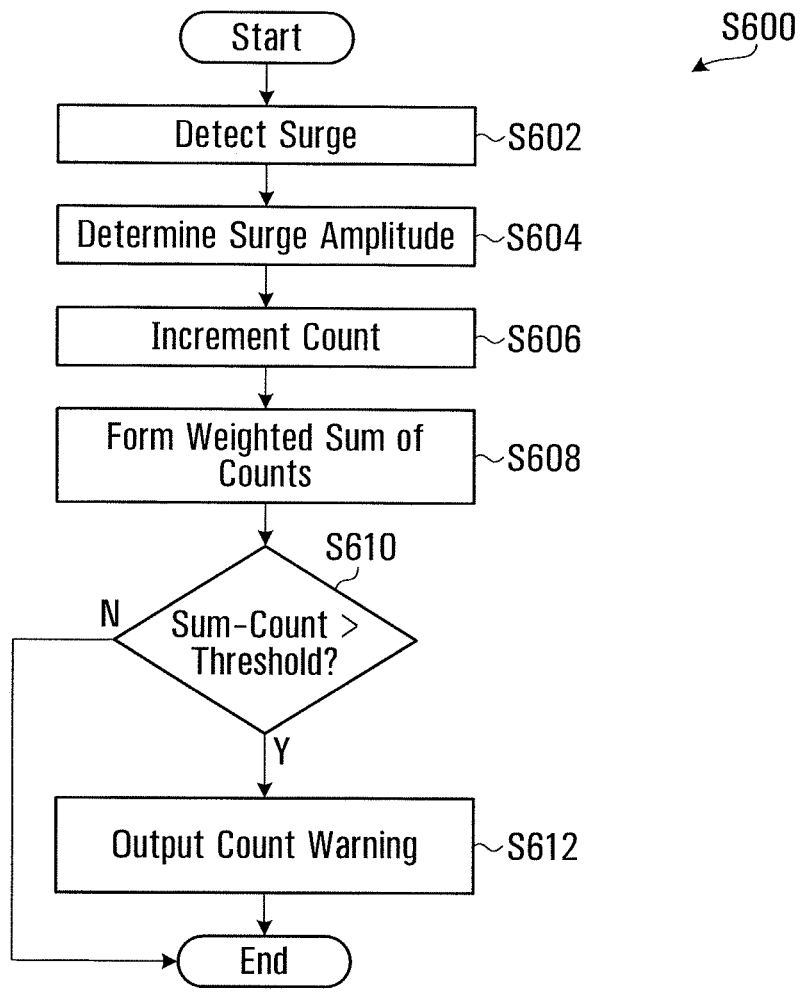
FIG. 6 is a flow charts of blocks performed by a processor of FIG. 5.

In operation, processor 108 performs blocks S600 depicted in FIG. 6. As illustrated, in block S602, processor 108 determines that one or more detectors 102 is providing a logic high signal. In block S604 processor 108 determines the threshold voltage represented by the detected surge and increments the count stored in memory 110 associated with that voltage threshold in block S606. The threshold voltage may, for example, equal the greatest threshold voltage for which an associated tuned detector 102 is providing a logic high signal.

In block S608 processor 108 may optionally form a weighted sum of surge counts, based on the various individual surge counts stored in memory 110. The sum of counts may, for example, be calculated as a weighted count of all the counted surges. This may be accomplished by weighting each detected and counted surge stored in memory 110 by a value proportional to its voltage and maintaining a sum of detected surges, so weighted.

Appropriate weights used by processor 108 may be determined empirically and stored in memory 110, depending on the failure contribution of each surge. This may, for example, be mathematically determined from the failure curves in FIG. 4. Higher voltage surges may be given a greater weighting than lower voltage surges, so that a combination of many smaller voltage surges may be given equal weighting as one high voltage surge—thereby allowing processor 108 to effectively integrate the cumulative effect on varistor 20 of multiple surges of different magnitude.

As will be appreciated, one or more indicator of the count or counts maintained by processor 108 and some indicator of the count or counts may be provided, by way of a display—in the form of one or more light emitting diodes (LEDs), a liquid crystal display (LCD) or the like (not specifically illustrated). Possibly, the indicator could provide an identification of the number of surges shunted by varistor 20. Such identification could include presenting a numeric count, or other indicator of count. Additionally or alternatively, once the count (or counts) cumulatively exceeds (or exceed) some threshold, as determined by processor 108 in block S610, the indicator of count may reflect likely future failure of varistor 20 (e.g. a warning) that may be output in block S612.

Blocks S600 may be repeated at the occurrence of each surge, as detected by failure detector 100.

In some embodiments, the cumulative count may be the described weighted sum of counts. Alternatively, the cumulative count of surges may be maintained as a collection of individual counts, and the indicator of likely future failure of varistor 20 may be provided if any of the individual counts exceeds some threshold (e.g. 50% of the rated counts for any given threshold voltage). Optionally, each of the multiple maintained counts may be made available to a user through a suitable LED or LCD interface.

The indicator of likely future failure output in block S612 may prompt a user/maintainer of circuit 10 to replace varistor 20.

Other techniques for assessing a cumulative count of surges affecting the life of varistor 20 will be apparent to persons of ordinary skill.

In alternate embodiments, processor 108 may also track the duration of each surge, and may weight the occurrence of a surge by its amplitude and duration in forming the cumulative count.

As will now be appreciated, processor 108 could be used for other purposes in circuit 10, and could, for example, be a processor used in the overall operation of the downstream circuit formed by components 18. In this way, varistor failure detector 100 could be added to existing circuit designs that already include a processor, at minimal cost— using only detectors 102. Processor readable instructions allowing such processors to function as described may be easily added to the firmware or operating system governing the operation of such processor.

In yet other alternate embodiments detectors 102 may be replaced by one or more suitable digital to analog converters (DACs), allowing processor 108 (suitably programmed) to detect amplitude and duration of surges. In further embodiments, the detectors 102 may be interconnected with an AC voltage produced from lines 12 and 14—for example directly across lines 12 and 14, or on the secondary side of a transformer like transformer 52 (FIG. 2).

As will be appreciated, once varistor 20 has been assessed to have shunted a number of surges as determined by failure detector 100, the replacement of varistor 20 may be advisable. As noted, suggested replacement may be prompted by detector 100, or simply assessed by a user from the indicatioln of count provided by detector 100. Possibly, varistor 20 may be replaced without replacing other components of protected circuit 10, and solderlessly—without soldering or removing solder.

Figure 7:
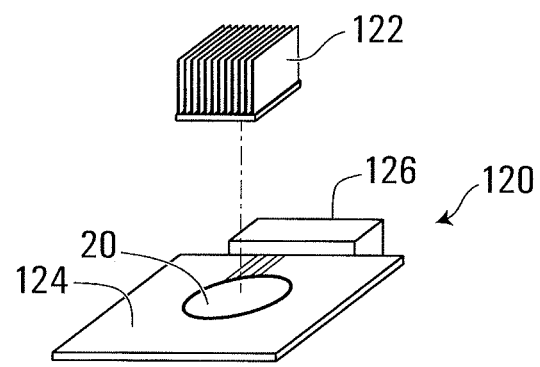
FIGS. 7 and 8 are perspective views of a varistor module, exemplary of an embodiment of the present invention
Figure 8:
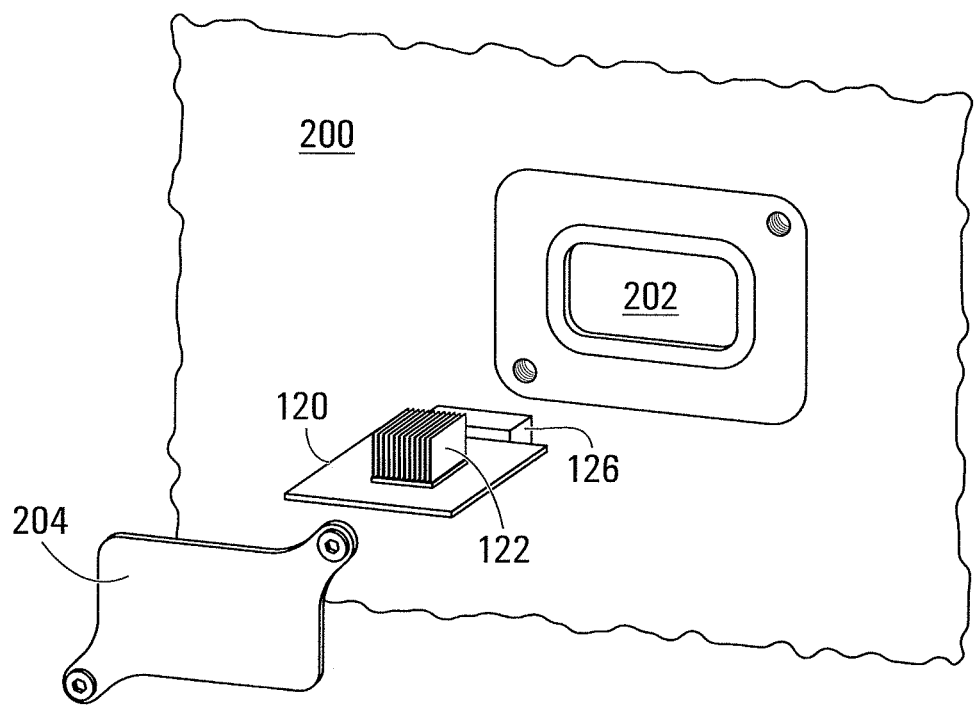

To that end, FIGS. 7 and 8 illustrate a varistor module 120, hosting varistor 20, mounted on a printed circuit board 128. Module 120 further includes a connector 126 interconnected with varistor 20, to allow varistor 20 to be removably connected to a power supply (such as the power supply of circuit 10 of FIG. 1) of an electronic device 200 (FIG. 8). Varistor 20 may be mounted on a surface of a substrate—such as printed circuit board 124, and may further be thermally protected by a heat sink 122 that is in thermal communication with varistor 20. Varistor module 120 may be inserted into a complementary opening 202 in device 200. Opening 202 may house a connector complementary to connector 126 for interconnection of varistor module 120 with circuit 10. A lid 204 may cover opening 202.

Optionally, in such an embodiment, varistor failure sensing circuit 100 may be combined with varistor 20 on printed circuit board 124 to form replaceable varistor module 120, complete with varistor 20, processor 108, surge detectors 102, memory 110 and a suitable indicator, used to provide the indicator of the count of surges shunted by varistor 20 (not specifically shown in FIGS. 7 and 8). Optionally, lid 204 may be transparent or translucent to allow viewing of the indicator without removal of lid 204. Again, in the case of failure, this entire varistor module 120 could be replaced.

Of course, the above described embodiments are intended to be illustrative only, and in no way limiting. The described embodiments are susceptible to many modifications of form, arrangement of parts, details and order of operation.

The invention is intended to encompass all such modification within its scope, as defined by the claims.

What is claimed is:

1. A method of operating a power supply comprising supply lines and a varistor interconnected with said supply lines to shunt surges on said supply lines, said method comprising:
    sensing a surge on said supply lines;
    protecting downstream components from said surge by clamping said surge by way of said varistor;
    sensing each said surge, and maintaining a cumulative count of surges shunted by said varistor;
    providing an indicator of a count reflecting surges shunted by said varistor, as indicated by said cumulative count;
    sensing surges having different voltage amplitudes, and maintaining counts of the surges having the different voltage amplitudes;
    calculating a weighted sum of surge counts by weighting each sensed and counted surge by a value proportional to the different voltage amplitudes; and
    maintaining the calculated weighted sum of surge counts; and
    wherein the calculated weighted sum of surge counts is indicative of likely future failure of the varistor.

2. The method of claim 1, wherein said power supply comprises an AC to DC supply that receives an AC supply voltage and provides a DC voltage and wherein said sensing is performed on either said DC voltage or said AC system voltage.

3. The method of claim 2, further comprising counting surges of different voltage amplitudes of said AC supply voltage by sensing said DC voltage.

4. The method of claim 3, wherein said cumulative count of surges includes a sum of surges above a defined threshold voltage.

5. The method of claim 4, wherein the calculating of the weighted sum of each sensed surge is further based on a respective duration of each surge.

6. The method of claim 1 wherein said sensing and maintaining a cumulative count are performed by a processor.

7. A varistor failure detector comprising:
    at least one surge detector in communication with a varistor, to detect surges shunted by said varistor, the detected surges including surges having different voltage amplitudes;
    a processor, in communication with said at least one surge detector, programmed to count surges shunted by said varistor, as indicated by said at least one surge detector; and
    memory to store at least one count representing a cumulative count of surges shunted by said varistor, the memory further configured to store counts of the surges having the different voltage amplitudes,
    wherein the processor is configured to calculate a weighted sum of surge counts by weighting each detected and counted surge by a value proportional to the different voltage amplitudes, and further configured to maintain the calculated weighted sum of surge counts; and
    wherein the calculated weighted sum of surge counts is indicative of a likely future failure of the varistor.

8. The varistor failure detector of claim 7, further comprising an indicator for providing a signal to a user that said varistor has shunted surges in excess of a threshold, as indicated by said cumulative count.

9. The varistor failure detector of claim 7, wherein said at least one surge detector comprises a plurality of opto-isolators, each tuned to detect a surge in excess of a particular amplitude.

10. A varistor module comprising a varistor and the varistor failure detector of claim 9.

11. The varistor failure detector of claim 7, wherein said cumulative count comprises a count of surges exceeding differing defined amplitudes.

12. The varistor failure detector of claim 7, wherein said processor is operable to measure a duration of each of said surges shunted by said varistor.

13. The varistor failure detector of claim 12, wherein said processor is operable to calculate said weighted sum further based on a respective duration of each surge.

14. A varistor module for interconnection with an electronic circuit, said varistor module comprising a substrate, a connector extending from said substrate, and a varistor electrically interconnected with said connector to allow solderless removal and replacement of said varistor module from said electronic circuit to allow said varistor to shunt surges on a supply line to a power supply of said electronic circuit;

at least one surge detector in communication with said varistor, detect surges shunted by said varistor including surges having different voltage amplitudes;

a processor, in communication with said at least one surge detector, programmed to count surges shunted by said varistor, as indicated by said at least one surge detector;

memory to store at least one count representing a cumulative count of surges shunted by said varistor, the memory further configured to store counts of the surges having the different voltage amplitudes, wherein the processor is configured to calculate a weighted sum of surge counts by weighting each detected and counted surge by a value proportional to the different voltage amplitudes and maintain the calculated weighted sum of surge counts; and wherein the calculated weighted sum of surge counts is indicative of a likely future failure of the varistor.

15. The varistor module of claim 14, further comprising a count indicator for providing an indicator of the number of counts shunted by said varistor.

* * * * *